(12) United States Patent
Yao et al.

(10) Patent No.: US 12,477,697 B2
(45) Date of Patent: Nov. 18, 2025

(54) HEAT DISSIPATION METHOD, HEAT DISSIPATION APPARATUS, AND CABINET

(71) Applicant: Huawei Technologies Co., Ltd., Shenzhen (CN)

(72) Inventors: Xidong Yao, Shenzhen (CN); Xiaoguang Sun, Dongguan (CN); Dongming Lu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 318 days.

(21) Appl. No.: 17/475,088

(22) Filed: Sep. 14, 2021

(65) Prior Publication Data

US 2021/0410336 A1  Dec. 30, 2021

Related U.S. Application Data

(63) Continuation of application No. PCT/CN2020/075161, filed on Feb. 14, 2020.

(30) Foreign Application Priority Data

Mar. 14, 2019 (CN) .......................... 201910195013.1

(51) Int. Cl.
*H05K 7/20* (2006.01)

(52) U.S. Cl.
CPC ..... *H05K 7/20736* (2013.01); *H05K 7/20781* (2013.01); *H05K 7/20836* (2013.01)

(58) Field of Classification Search
CPC ........... H05K 7/20736; H05K 7/20781; H05K 7/20836; G06F 1/20
See application file for complete search history.

(56) References Cited

U.S. PATENT DOCUMENTS

| 2002/0101721 A1* | 8/2002 | Blood | H05K 7/1489 |
| | | | 361/679.41 |
| 2004/0057211 A1* | 3/2004 | Kondo | G06F 1/20 |
| | | | 361/696 |

(Continued)

FOREIGN PATENT DOCUMENTS

| CN | 201837955 U | 5/2011 |
| CN | 102467203 A | 5/2012 |

(Continued)

OTHER PUBLICATIONS

Fujimoto et al, 'Information Device and Information Device Blade', Nov. 3, 2016, Hitachi Ltd. (Translation of WO2016174732 A1) (Year: 2016).*

*Primary Examiner* — Jayprakash N Gandhi
*Assistant Examiner* — Jeffrey Francis Stoll
(74) *Attorney, Agent, or Firm* — Conley Rose, P.C.

(57) ABSTRACT

The cabinet includes a body and a heat dissipation apparatus. A plurality of installation slots for servers to enter along a preset installation direction are disposed on the body. The heat dissipation apparatus is configured to perform heat dissipation on devices of the servers, the heat dissipation apparatus is disposed on at least one side of the body along the installation direction, and the heat dissipation apparatus is connected to the devices of the servers. In this way, heat dissipation is performed on each server in the body, and space reserved between two adjacent rows of cabinets can be effectively used to reduce occupation of space in a left-right direction or an up-down direction in the body, thereby reducing limitation on a size of the cabinet and a size of a device in the cabinet.

20 Claims, 8 Drawing Sheets

(56) References Cited

U.S. PATENT DOCUMENTS

| | | | |
|---|---|---|---|
| 2004/0095722 A1 | 5/2004 | Rong-Yao | |
| 2005/0286235 A1* | 12/2005 | Randall | H05K 7/1492 361/727 |
| 2011/0051372 A1* | 3/2011 | Barringer | H05K 7/2079 29/890.03 |
| 2011/0277967 A1 | 11/2011 | Fried et al. | |
| 2013/0102237 A1* | 4/2013 | Zhou | G06F 1/206 361/679.48 |
| 2013/0104383 A1 | 5/2013 | Campbell et al. | |
| 2013/0163198 A1* | 6/2013 | Li | H05K 7/1492 211/26 |
| 2013/0340994 A1 | 12/2013 | David et al. | |
| 2014/0238516 A1* | 8/2014 | Demange | H05K 7/20218 137/599.01 |
| 2014/0321050 A1* | 10/2014 | Sato | H05K 7/20818 361/679.47 |
| 2015/0026515 A1* | 1/2015 | Arnouse | H05K 7/20736 714/10 |
| 2015/0173254 A1* | 6/2015 | Rodriguez | H02J 4/00 361/699 |
| 2015/0189787 A1* | 7/2015 | Bailey | H05K 7/20736 361/679.48 |
| 2016/0066480 A1* | 3/2016 | Eckberg | F16L 37/34 361/679.53 |
| 2016/0120059 A1* | 4/2016 | Shedd | F28D 15/00 165/244 |
| 2016/0298883 A1* | 10/2016 | Louvar | H05K 7/20827 |
| 2017/0177007 A1 | 6/2017 | Shelnutt et al. | |
| 2017/0177041 A1* | 6/2017 | Shelnutt | H05K 7/20809 |
| 2017/0257980 A1* | 9/2017 | Fukunaga | F16L 37/40 |
| 2017/0344445 A1* | 11/2017 | Vanderah | G05B 19/00 |
| 2018/0042140 A1 | 2/2018 | Pan et al. | |
| 2018/0242478 A1* | 8/2018 | Cui | H01R 3/08 |

FOREIGN PATENT DOCUMENTS

| | | |
|---|---|---|
| CN | 103313578 A | 9/2013 |
| CN | 104320953 A | 1/2015 |
| CN | 204948593 U | 1/2016 |
| CN | 105764306 A | 7/2016 |
| CN | 205378479 U | 7/2016 |
| CN | 106088693 A | 11/2016 |
| CN | 107960049 A | 4/2018 |
| CN | 108235655 A | 6/2018 |
| CN | 207652877 U | 7/2018 |
| CN | 207836045 U | 9/2018 |
| CN | 110062560 A | 7/2019 |
| WO | WO-2016174732 A1 * | 11/2016 |

* cited by examiner

```
Control a heat dissipation device to start a liquid cooling mode,
to perform liquid cooling on first-type devices on servers          — S101

Control the heat dissipation device to start an air cooling mode,
to perform air cooling on second-type devices on the servers        — S102
```

HEAT DISSIPATION METHOD, HEAT DISSIPATION APPARATUS, AND CABINET

CROSS-REFERENCE TO RELATED APPLICATIONS

This is a continuation of International Patent Application No. PCT/CN2020/075161, filed on Feb. 14, 2020, which claims priority to Chinese Patent Application No. 201910195013.1, filed on Mar. 14, 2019. The disclosures of the aforementioned applications are hereby incorporated by reference in their entireties.

TECHNICAL FIELD

Embodiments of this application relate to the field of server technologies, and in particular, to a heat dissipation method, a heat dissipation apparatus, and a cabinet.

BACKGROUND

With the development of technologies in the computer field, more and more data centers are deployed with a large quantity of servers. The data center uses cabinets to house the servers, and the servers may be installed in the cabinets along a preset installation direction. Each cabinet may provide electric energy and a switching device for a plurality of servers in the cabinet.

Currently, as highly integrated chips with high power consumption are increasingly applied to servers, the servers generate more heat in a running process. Consequently, heat dissipation requirements of the servers are higher. In addition, as a volume of data processed by a server in a data center increases, heat generated in the data center increases, and temperature of an equipment room in which the data center is located becomes higher. In a conventional heat dissipation method, the temperature of the equipment room is controlled usually by using an air conditioner or a fan, and the server performs heat dissipation on a device in the server in an air cooling manner or a liquid cooling manner. However, in the foregoing method, costs are increased, and a cabinet size needs to be changed to match a heat dissipation solution of the server. Therefore, how to reduce a size limitation on a cabinet while a heat dissipation requirement of a server is met becomes one of problems to be urgently resolved in the industry.

SUMMARY

This application provides a heat dissipation method, a heat dissipation apparatus, and a cabinet, to reduce a size limitation on the cabinet while a heat dissipation requirement of a server is met.

This application provides a cabinet, including a body. A plurality of installation slots are disposed on the body, and servers may enter the installation slots along a preset installation direction. The cabinet further includes a heat dissipation apparatus. The heat dissipation apparatus is configured to perform heat dissipation on devices of the servers, the heat dissipation apparatus is disposed on at least one side of the body along the installation direction, and the heat dissipation apparatus is connected to the devices of the servers. The installation direction is set along a front-rear direction of the body, that is, the heat dissipation apparatus may be disposed on a front side and/or a rear side of the body.

In this application, the heat dissipation apparatus is disposed on at least one side of the body along the installation direction of the servers. That is, the heat dissipation apparatus is disposed on the front side and/or the rear side of the body. In this way, the heat dissipation apparatus performs heat dissipation on each server in the body, and space reserved between two adjacent rows of cabinets can be effectively used to reduce occupation of space in a left-right direction or an up-down direction inside the body, thereby reducing limitation on a size of the cabinet and a size of a device in the cabinet.

In a possible implementation, the installation slot has a front opening for the server to enter, and the heat dissipation apparatus may be disposed on the rear side of the body opposite the front opening, to reduce occupation of space in a left-right direction or an up-down direction in the body. This reduces limitation on a size of the cabinet and a size of a device in the cabinet, and helps an operator maintain a device such as the server in the body from the front side of the body, that is, improves maintenance convenience of the device such as the server.

In a possible implementation, a rear opening is disposed on the rear side of the body opposite the front opening, and the heat dissipation apparatus may be installed at the rear opening of the body. In this way, the heat dissipation apparatus may be maintained directly at the rear opening of the body without detaching the heat dissipation apparatus, thereby improving maintenance convenience of the heat dissipation apparatus.

In a possible implementation, the heat dissipation apparatus includes a liquid cooling unit. The liquid cooling unit is connected to a liquid cooling component on the server. In this way, the liquid cooling unit provides relatively low-temperature cooling liquid for the liquid cooling component, and processes relatively high-temperature reflux liquid that flows out of the liquid cooling component, thereby implementing liquid cooling on the device on the server. The liquid cooling component may be disposed on a surface of a first-type device with relatively high power consumption on the server. In this way, heat generated by the first-type device is conducted to the interior of the liquid cooling component through a surface of the liquid cooling component, and then heat is conducted to the exterior of the first-type device by using liquid flowing in the liquid cooling component, to improve heat dissipation effects of the device on the server. Optionally, the liquid cooling unit may include a coolant distribution unit (CDU).

In a possible implementation, the liquid cooling component on the surface of the first-type device may include a liquid cooling plate, so that there is a relatively large contact area between the liquid cooling component and the first-type device, to improve heat dissipation effects of the first-type device. Optionally, an area of the liquid cooling plate is greater than or equal to an area of the first-type device, to further increase a contact area between the liquid cooling plate and the first-type device, and improve heat dissipation effects of the first-type device. Optionally, the first-type device may include a central processing unit.

In a possible implementation, the heat dissipation apparatus further includes a liquid distribution pipe, and the liquid distribution pipe is connected between the liquid cooling unit and the liquid cooling component. The liquid distribution pipe is configured to distribute relatively low-temperature cooling liquid that is provided by the liquid cooling unit to the liquid cooling component on each server, is further configured to collect relatively high-temperature reflux liquid that flows out of the liquid cooling component on each server into the liquid cooling unit, thereby implementing connection between the liquid cooling channel of the liquid cooling component on each server and the liquid cooling unit. In this implementation, there is no need to separately connect the liquid cooling component on each server to the liquid cooling unit by using a hose. This helps reduce a quantity of hoses in the cabinet and reduces interference to another channel or line.

Optionally, a floating liquid cooling joint configured to separately connect to the liquid cooling component on each server is disposed on the liquid distribution pipe, or a floating liquid cooling joint configured to connect to the liquid distribution pipe is disposed on each server. In this way, when the server is connected to the liquid distribution pipe, there is a specific fault tolerance range, namely, a fit tolerance, thereby helping improve reliability of connection between the server and the liquid distribution pipe. The server and the liquid distribution pipe may have fault tolerance ranges, namely, fit tolerances, in three dimensions. The fault tolerance range, namely, the fit tolerance, may be ±2 mm.

Optionally, the liquid distribution pipe and the liquid cooling unit are located on a same side of the body, to facilitate connection between the liquid distribution pipe and the liquid cooling unit. The liquid distribution pipe may alternatively be integrated with the liquid cooling unit, to improve an integration degree, simplify an assembly process, and help reduce liquid leakage.

In a possible implementation, the liquid cooling unit in the heat dissipation apparatus may include a first heat exchanger, an inner circulation path, and an outer circulation path. The inner circulation path is connected to the liquid cooling component on the server, and the heat exchanger is available for heat exchange between the inner circulation path and the outer circulation path, to cool liquid in the inner circulation path. Therefore, cooling liquid in the inner circulation path can continuously perform liquid cooling on the device on the server.

In a possible implementation, the heat dissipation apparatus further includes a plurality of water pumps that are configured to provide power for liquid to flow between the liquid cooling unit and the liquid cooling component. Optionally, the plurality of water pumps may be disposed in the liquid cooling unit. A controller may be disposed in the liquid cooling unit, and the plurality of water pumps may be electrically connected to the controller. In this way, the controller can control a working status of each water pump, to improve flexibility of the heat dissipation apparatus. The controller may be configured to: when it is detected that a total power of the servers in the cabinet exceeds a first threshold, set the plurality of water pumps to be in a first working state in which rotational speeds of the water pumps are relatively large, to improve heat dissipation efficiency; or when it is detected that a total power of the servers in the cabinet is less than a first threshold, set the plurality of water pumps to be in a second working state in which rotational speeds of the water pumps are relatively low, to save energy while dissipating heat.

In a possible implementation, a temperature sensor is disposed in the liquid cooling unit, and the temperature sensor is electrically connected to a controller of the liquid cooling unit. The temperature sensor is configured to detect temperature of liquid at a water inlet end of an inner circulation path or a water outlet end of an outer circulation path in the liquid cooling unit; and the controller is configured to control a working status of each water pump in the liquid cooling unit based on the temperature of the liquid that is detected by the temperature sensor. The controller is configured to: when the temperature of the liquid exceeds a second threshold, set a plurality of water pumps to be in a first working state in which rotational speeds of the water pumps are relatively large, to improve heat dissipation efficiency; or when the temperature of the liquid is less than a second threshold, set a plurality of water pumps to be in a second working state in which rotational speeds of the water pumps are relatively low, to save energy while dissipating heat.

In a possible implementation, a controller of the liquid cooling unit is configured to set a plurality of water pumps in the liquid cooling unit to be in a load sharing mode, to help ensure heat dissipation efficiency. When the plurality of water pumps work in the load sharing mode, the plurality of water pumps jointly undertake work of liquid flowing through a plurality of servers. During specific implementation, different thresholds may be preset to control rotational speeds of the plurality of water pumps, to effectively perform heat dissipation on the first-type device on the server.

In a possible implementation, a controller of the liquid cooling unit is configured to set a plurality of water pumps in the liquid cooling unit to be in an active/standby mode. In this way, when a water pump is faulty, another water pump can take over the work of the water pump, thereby reducing impact on the servers in the entire cabinet, and improving maintenance efficiency. Some of the plurality of water pumps are water pumps in an active state, and the rest water pumps are water pumps in a standby state. The controller may be configured to: when the water pumps in the active state are abnormal, control the water pumps in the standby state to work.

In a possible implementation, the heat dissipation apparatus further includes an air-to-liquid unit, and the air-to-liquid unit and a fan on the server are separately disposed on two sides of the body along the installation direction. In this way, the air-to-liquid unit works with the fan on the server. Therefore, the fan on the front side of the server blows hot air in the body to the air-to-liquid unit, and liquid in the air-to-liquid unit performs heat exchange with the hot air to form cold air to be discharged. This can reduce impact of exhaust air of each cabinet server on internal temperature of a data center equipment room, and reduce impact on other cabinet servers around the cabinet server, thereby help reduce a quantity of cabinets in the data center equipment room, to reduce costs. Optionally, the air-to-liquid unit includes at least one of the following: an air-to-liquid heat exchanger, a finned radiator, or a radiating pipe. A second-type device may include an internal memory with relatively lower power consumption, and the like.

In a possible implementation, there are a plurality of air-to-liquid units, and the plurality of air-to-liquid units are symmetrically arranged relative to the liquid cooling unit, to improve heat dissipation uniformity. Optionally, the air-to-liquid unit may be integrated with the liquid cooling unit, to improve an integration degree of the heat dissipation apparatus and simplify assembly.

In a possible implementation, the cabinet further includes a cable path. The cable path is configured to communicatively connect each server to a corresponding switch. The cable path can be formed by using a bundled cable, and the bundled cable may extend from top to bottom, thereby helping the bundled cable separately connect to each server and connect to a device such as the switch. This helps reduce a quantity of cables in the body and simplify cable layout, and helps reduce interference of the cable path to another path, line, or pipeline, thereby helping avoid a problem such as a maintenance difficulty caused by excessive cables.

In a possible implementation, the cable path and the heat dissipation apparatus are located on a same side of the body, for example, the rear side of the body. The cable path is disposed on the rear side of the body, and therefore, when a device in the cabinet is maintained, it is convenient to operate from the front side of the cabinet, thereby reducing detachment of the cable path, and the like on the rear side of the body, and improving maintenance convenience.

In a possible implementation, a floating signal connector that is configured to separately connect to each server is disposed on the cable path, or a floating signal connector that is configured to connect to the cable path is disposed on each server. In this way, when the server is connected to the cable path, there may be a specific fault tolerance range, namely, a fit tolerance, thereby helping improve reliability of connection between the server and the cable path.

In a possible implementation, the cabinet further includes a power supply path. The power supply path is configured to provide electric energy for each server, to simplify lines in the body. The power supply path may be formed by a power supply copper bar. The power supply copper bar may cooperate with the server at any position thereof In a possible implementation, the power supply path and the heat dissipation apparatus are located on a same side of the body, for example, the rear side of the body. Therefore, when a device in the cabinet is maintained, it is convenient to operate from the front side of the cabinet, thereby reducing detachment of the power supply path, and the like on the rear side of the body, and improving maintenance convenience.

In a possible implementation, a floating power connector that is configured to connect to the wire supply channel is disposed on each server, to improve reliability of connection between the server and the cable path.

In a possible implementation, the cable path, the power supply path, and the liquid distribution pipe are disposed side by side in a direction perpendicular to the installation direction and parallel to the server, and therefore, the cable path, the power supply path, and the liquid distribution pipe are disposed independently of each other.

In a possible implementation, at least one fastening beam is disposed on the body. The fastening beam is perpendicular to the installation direction and is disposed parallel to the server, and the cable path, the power supply path, and the liquid distribution pipe in the heat dissipation apparatus are all fastened to the fastening beam. This facilitates co-plane of matching parts between the cable path, the power supply path, and the liquid distribution pipe and the servers, thereby helping ensure reliability of matching between the servers and the cable path, the power supply path, and the liquid distribution pipe.

In a possible implementation, a power supply module is disposed in the body, and the power supply module supplies electric energy to each server through the power supply path. The power supply module includes at least one of the following: a power module or a battery module that may be installed in the installation slot, to enrich a power supply mode.

This application further provides a heat dissipation method, applied to a cabinet. The cabinet includes a body and a heat dissipation apparatus. A plurality of installation slots for servers to enter along a preset installation direction are disposed on the body. The heat dissipation apparatus is configured to perform heat dissipation on devices of the servers, the heat dissipation apparatus is disposed on at least one side of the body along the installation direction, and the heat dissipation apparatus is connected to the devices of the servers. The method includes: controlling the heat dissipation apparatus to start a liquid cooling mode, to perform liquid cooling on first-type devices on the servers; and controlling the heat dissipation apparatus to start an air cooling mode, to perform air cooling on second-type devices on the servers.

In this application, the heat dissipation apparatus disposed on at least one side of the body along the installation direction of the servers is controlled to implement air cooling and/or liquid cooling on the servers. In addition, space reserved between two adjacent rows of cabinets can be effectively used to reduce occupation of space in a left-right direction or an up-down direction inside the body, thereby reducing limitation on a size of the cabinet and a size of a device in the cabinet.

In a possible implementation, a plurality of water pumps are disposed in the heat dissipation apparatus. The method further includes: obtaining a total power consumption value of the servers in the cabinet, and comparing the total power consumption value with a first threshold; and if the total power exceeds the first threshold, setting the plurality of water pumps to be in a first working state in which rotational speeds of the water pumps are relatively large, to improve heat dissipation efficiency; or if the total power is less than the first threshold, setting the plurality of water pumps to be in a second working state in which rotational speeds of the water pumps are relatively low, to save energy while dissipating heat. The rotational speeds of the water pumps working in the first working state are greater than the rotational speeds of the water pumps working in the second working state.

In a possible implementation, the heat dissipation apparatus includes a plurality of water pumps. The heat dissipation method further includes: controlling the plurality of water pumps to enter a load sharing mode, so that the plurality of water pumps work together, to help ensure heat dissipation efficiency. When the plurality of water pumps work in the load sharing mode, the plurality of water pumps jointly undertake work of liquid flowing through a plurality of servers. During specific implementation, different thresholds may be preset to control rotational speeds of the plurality of water pumps, to effectively perform heat dissipation on the first-type devices on the servers.

In a possible implementation, a plurality of water pumps are controlled to enter a load active/standby mode, so that a water pump in a standby state is started when a water pump in an active state is abnormal. In this way, when a water pump is faulty, another water pump can take over the work of the water pump, thereby reducing impact on the servers in the entire cabinet, and improving maintenance efficiency.

In a possible implementation, a plurality of water pumps are disposed in the heat dissipation apparatus. The heat dissipation method further includes: obtaining temperature of liquid at a water inlet end of an inner circulation path or a water outlet end of an outer circulation path in a liquid cooling unit of the heat dissipation apparatus, and comparing the temperature of the liquid with a second threshold; and if the temperature of the liquid exceeds the second threshold, setting the plurality of water pumps to be in a first working state in which rotational speeds of the water pumps are relatively large, to improve heat dissipation efficiency; or if the temperature of the liquid is less than the second threshold, setting the plurality of water pumps to be in a second working state in which rotational speeds of the water pumps are relatively low, to save energy while dissipating heat. The rotational speeds of the water pumps working in the first working state are greater than the rotational speeds of the water pumps working in the second working state.

This application further provides a heat dissipation apparatus, applied to a cabinet, and including: a first control module, configured to control the heat dissipation apparatus to start a liquid cooling mode, to perform liquid cooling on first-type devices on servers in the cabinet; and a second control module, configured to control the heat dissipation apparatus to start an air cooling mode, to perform air cooling on second-type devices on the servers.

In a possible implementation, the first control module is further configured to: obtain a total power consumption value of the servers in the cabinet, and compare the total power consumption value with a first threshold; and if the total power exceeds the first threshold, set a plurality of water pumps to be in a first working state; or if the total power is less than the first threshold, set the plurality of water pumps to be in a second working state. Rotational speeds of the water pumps working in the first working state are greater than rotational speeds of the water pumps working in the second working state.

In a possible implementation, the first control module is further configured to control a plurality of water pumps to enter a load sharing mode, so that the plurality of water pumps work together.

In a possible implementation, the first control module is further configured to control a plurality of water pumps to enter a load active/standby mode, so that a water pump in a standby state is started when a water pump in an active state is abnormal.

In a possible implementation, the first control module is further configured to: obtain temperature of liquid at a water inlet end of an inner circulation path or a water outlet end of an outer circulation path in a liquid cooling unit of the heat dissipation apparatus, and compare the temperature of the liquid with a second threshold; and if the temperature of the liquid exceeds the second threshold, set a plurality of water pumps to be in a first working state; or if the temperature of the liquid is less than the second threshold, set a plurality of water pumps to be in a second working state. Rotational speeds of the water pumps working in the first working state are greater than rotational speeds of the water pumps working in the second working state.

In this application, the heat dissipation apparatus is disposed on at least one side of the body along the installation direction of the servers. In this way, heat dissipation can be performed on each server in the body. In addition, space reserved between two adjacent rows of cabinets can be effectively used to reduce occupation of space in a left-right direction or an up-down direction inside the body, thereby reducing limitation on a size of the cabinet and a size of a device in the cabinet.

This application further provides a heat dissipation apparatus, applied to a cabinet, and including a processor, and a memory that is configured to store processor-executable instructions. The processor is configured to execute the executable instructions to implement the method according to any one of the foregoing descriptions.

In this application, the heat dissipation apparatus is disposed on at least one side of the body along the installation direction of the servers. In this way, heat dissipation can be performed on each server in the body. In addition, space reserved between two adjacent rows of cabinets can be effectively used to reduce occupation of space in a left-right direction or an up-down direction inside the body, thereby reducing limitation on a size of the cabinet and a size of a device in the cabinet.

DESCRIPTION OF EMBODIMENTS

Figure 1:
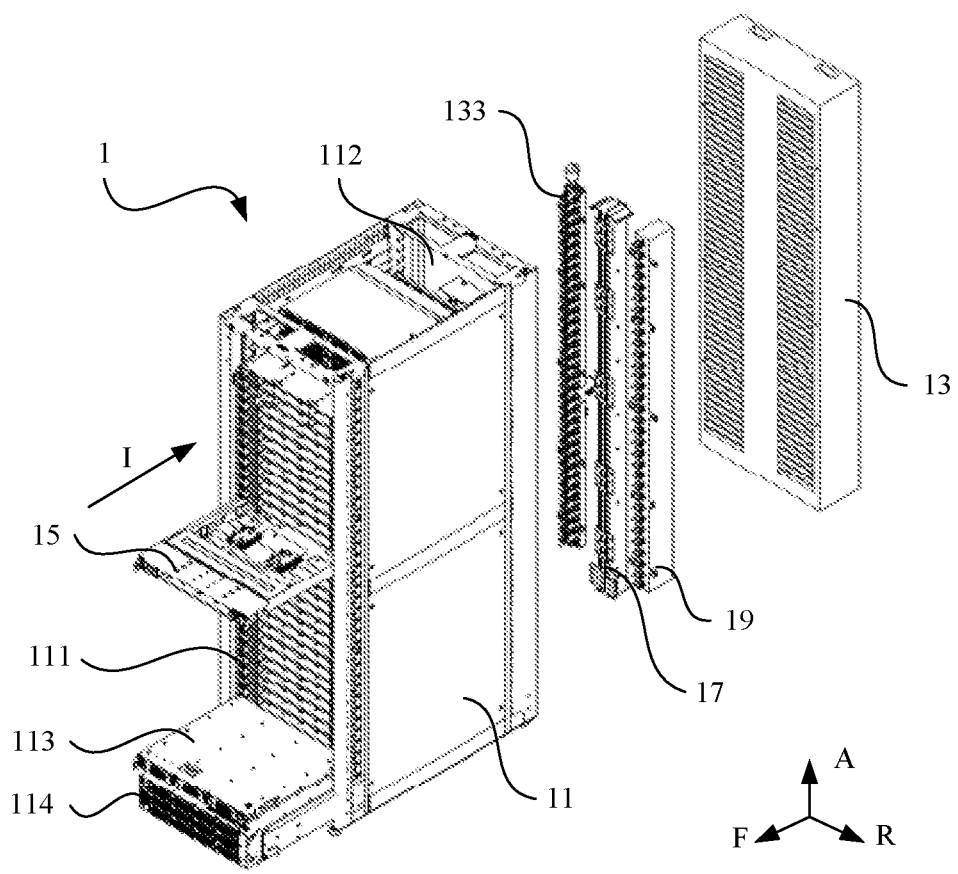
FIG. 1 is a schematic exploded view of a cabinet according to an embodiment of this application.

In the embodiments of this application, unless otherwise specified and limited, terms such as "installation", "connection", "fasten", "electrical connection", and "communication connection" should be understood in a broad sense. For example, a "connection" may be a fixed connection, a detachable connection, or an integrated connection. Alternatively, a "connection" may be a direct connection, or an indirect connection through an intermediate medium, or may be an interconnection between two elements or an interaction relationship between two elements. For persons of ordinary skill in the art, specific meanings of the foregoing terms in this application may be understood according to a specific situation.

In the embodiments of this application, for ease of clear description, words such as "first" and "second" are used to distinguish between same items or similar items that have basically the same or similar functions or purposes. A person skilled in the art may understand that "first" and "second" do not limit a quantity or a sequence.

In addition, in the embodiments of this application, for ease of description, it may be assumed that when a cabinet works normally, an end, of a body, facing a support surface such as the ground is a lower end (or a bottom end); an end, of the body, opposite the support surface such as the ground is an upper end; a side, of the body, facing a server installation engineer is a front side; a rear side (or a back side) of the body is opposite the front side; and the remaining two sides are a left side and a right side.

Terms such as "upper", "lower", "front", "rear", "left", and "right" are used to describe a relative location relationship of structures in the accompanying drawings, and are merely for ease of description, but are not intended to limit an implementable scope of this application. A change or adjustment of a relative relationship thereof shall fall within the implementable scope of the embodiments of this application when technical content is not substantially modified.

In addition, it may be assumed that a left-right direction is used as a length direction of the cabinet, a front-rear direction is used as a width direction of the cabinet, and an up-down direction is used as a height direction of the cabinet.

Currently, a plurality of servers are usually disposed in a data center equipment room to meet a requirement for a data processing capability. The plurality of cabinet servers are usually arranged side by side and close to each other in a length direction, namely, a left-right direction, so that the cabinet servers are arranged compactly and regularly. Specific space is usually reserved between two adjacent rows of cabinet servers. To be specific, there is a preset distance between two adjacent cabinet servers in a front-rear direction, namely, a width direction of the cabinet server. This helps an operator operate the servers or observe statuses of the cabinet servers from front sides of the cabinet servers.

In a conventional technology, to meet heat dissipation requirements of servers, a heat dissipation apparatus such as a water distribution component, a coolant distribution unit (CDU), or an air-to-liquid heat exchanger is usually integrated into a cabinet. In addition, the heat dissipation apparatus such as the water distribution component, the liquid cooling CDU, or the air-to-liquid heat exchanger is usually disposed on the left side or right side or at the top end in the cabinet. Consequently, available space in the cabinet is occupied, and a size of the cabinet and a size of a device in the cabinet are limited. Furthermore, during maintenance, a shutdown of the entire cabinet is usually required for detachment of the heat dissipation apparatus from the cabinet.

An embodiment provides a cabinet, which reduces cabinet space occupied by a heat dissipation apparatus while heat of servers in the cabinet is effectively dissipated, and is easy to maintain.

Figure 2:
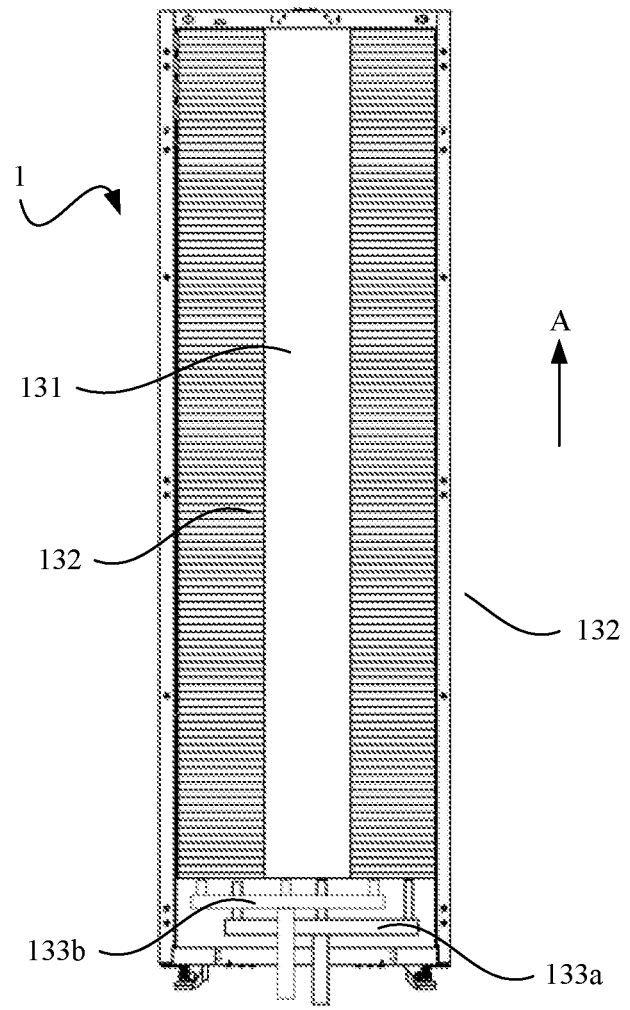
FIG. 2 is a rear view of a cabinet according to an embodiment of this application.
Figure 3:
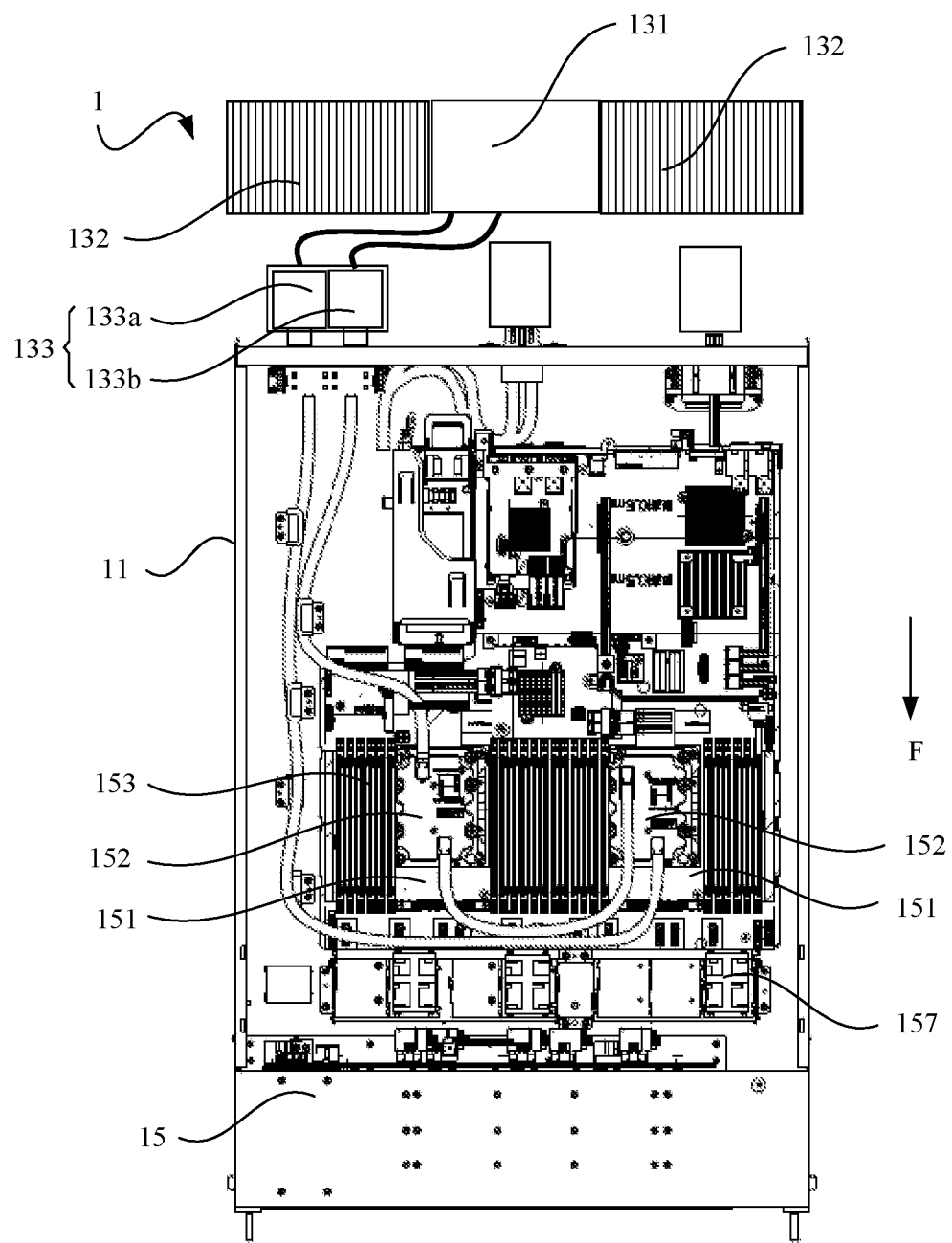
FIG. 3 is a top view of a cabinet according to an embodiment of this application.

Refer to FIG. 1 to FIG. 3. A direction indicated by an arrow A is upward, a direction indicated by an arrow R is rightward, a direction indicated by an arrow F is forward, and an arrow I is used to indicate an installation direction of a server. If a front-to-rear direction is used as a main view direction, FIG. 2 is a rear view, and FIG. 3 is a top view.

A cabinet 1 shown in FIG. 1 to FIG. 3 includes a body 11 and a heat dissipation apparatus 13. The body 11 may be supported on a support surface such as the ground, and the body 11 is used to house devices such as a server switch and servers 15. For example, a plurality of installation slots 111 used to install the servers 15 are disposed on the body 11, and the servers 15 may be installed into the installation slots 111 along a preset installation direction. The heat dissipation apparatus 13 is configured to perform heat dissipation on each server 15. The heat dissipation apparatus 13 is disposed on one side of the body 11.

The plurality of installation slots 111 disposed on the body 11 may be sequentially arranged from top to bottom, that is, the plurality of installation slots 111 may be stacked up and down. In this way, the plurality of servers 15 may also be arranged sequentially from top to bottom, that is, the plurality of servers 15 may also be stacked up and down.

In a possible embodiment, the height of each installation slot 111 may be set based on a size defined by a standards organization. For example, the height of each installation slot 111 is set according to a unit (unit, u) defined by the Electronic Industries Alliance, where 1 u is equal to 44.45 millimeters.

A front side of the installation slot 111 may have a front opening connected to space outside the body 11, so that the server 15 may enter the installation slot 111 from the front opening until reaching a preset installation position of the server. In this way, the server 15 may gradually enter the installation slot 111 of the body 11 from front to rear. In other words, the installation direction of the server 15 is a front-to-rear direction shown in FIG. 1.

When the server 15 reaches or is located at the preset installation position of the server 15, the server 15 may be installed in the installation slot 111 in a conventional connection manner such as a bonding, welding, clamping, or fastening manner. This helps ensure reliability of an electrical connection or a communication connection between the server 15 and another device (for example, a switch) in the cabinet.

Optionally, the server 15 may be detachably installed in the installation slot 111 in a conventional detachable connection manner such as a clamping manner or a fastening manner. This facilitates detachment of the server 15 when the server 15 is maintained.

Certainly, the installation manner of the server 15 is not limited thereto, as long as the server 15 can be reliably fastened to the preset installation position of the server 15 after the server 15 reaches the preset installation position of the server 15.

The heat dissipation apparatus 13 is mainly configured to perform heat dissipation on each server 15 in the body 11, for example, may perform heat dissipation on each server 15 in at least one of the following heat dissipation manners: an air cooling manner, a liquid cooling manner, or an air cooling and liquid cooling hybrid manner.

The heat dissipation apparatus 13 may extend from top to bottom, to facilitate uniform heat dissipation performed on the servers 15 that are stacked up and down. The heat dissipation apparatus 13 may be disposed on at least one side of the body 11 along the installation direction, where the at least one side of the body 11 along the installation direction is a front side or a rear side of the body 11. In other words, the heat dissipation apparatus 13 may be disposed on the front side or the rear side of the body 11.

In some embodiments, the heat dissipation apparatus 13 may be disposed on the front side of the body 11. In this case, the heat dissipation apparatus 13 may be detachably installed on the front side of the body 11 in a conventional detachable connection manner such as a clamping manner or a fastening manner. In this way, when the heat dissipation apparatus 13 is maintained, the heat dissipation apparatus 13 can be conveniently and quickly detached from the body 11. This improves maintenance convenience of the heat dissipation apparatus 13.

In some embodiments, the heat dissipation apparatus 13 may be disposed on the rear side of the body 11. In this case, when a device such as the server 15 needs to be maintained, the server 15 may be taken out directly from the front opening of the installation slot 111 without detaching the heat dissipation apparatus 13 from the body 11. This improves maintenance convenience of the device such as the server 15.

In addition, in this example, the heat dissipation apparatus 13 may be detachably installed on the front side of the body 11 in a conventional detachable connection manner such as a clamping manner or a fastening manner. In this way, when the heat dissipation apparatus 13 is maintained, the heat dissipation apparatus 13 can be conveniently and quickly detached from the body 11. This improves maintenance convenience of the heat dissipation apparatus 13.

In the cabinet 1 provided in this embodiment, the heat dissipation apparatus 13 is disposed on at least one side of the body 11 along the installation direction of the server 15. In other words, the heat dissipation apparatus 13 is disposed on the front side and/or the rear side of the body 11. In this way, the heat dissipation apparatus 13 performs heat dissipation on each server 15 in the body 11, and space reserved between two adjacent rows of cabinets can be effectively used to reduce occupation of space in a left-right direction or an up-down direction inside the body 11, thereby reducing limitation on a size of the cabinet and a size of a device in the cabinet.

Optionally, a rear opening 112 is disposed on the rear side, of the body 11, opposite the front opening, and the heat dissipation apparatus 13 is installed at the rear opening 112 of the body 11. In this way, the heat dissipation apparatus 13 is disposed on the rear side of the body 11 in an exposed manner. This not only reduces occupation of available space in the body 11, but also facilitates heat dissipation of the heat dissipation apparatus 13, and helps air outside the body 11 enter the body 11 to perform heat dissipation on a device in the body 11. In addition, the heat dissipation apparatus 13 may be maintained directly at the rear opening 112 of the body 11 without detaching the heat dissipation apparatus 13, thereby further improving maintenance convenience of the heat dissipation apparatus 13.

Optionally, the heat dissipation apparatus 13 includes a liquid cooling unit 131. The liquid cooling unit 131 is connected to a liquid cooling component 152 on the server 15. The liquid cooling component 152 is disposed on a surface of a first-type device on the server 15, to perform liquid cooling on the first-type device.

The first-type device on the server 15 is a device with relatively high power consumption, for example, a processor 151 shown in FIG. 3. In other words, the first-type device such as the processor 151 has relatively high temperature and has a relatively high requirement for heat dissipation. Therefore, the liquid cooling component 152 may be disposed on a surface, such as an upper surface, of the first-type device. A liquid cooling channel through which liquid can pass is disposed in the liquid cooling component 152, and the liquid cooling channel may be connected to the liquid cooling unit 131 by using a hose. In this way, the liquid cooling unit 131 provides relatively low-temperature cooling liquid for the liquid cooling component 152, and processes relatively high-temperature reflux liquid that flows out of the liquid cooling component 152.

For example, the liquid cooling component 152 may include a liquid cooling plate. The liquid cooling plate is in a plate shape and has an area that is greater than or equal to an area of the first-type device, so that the liquid cooling plate has a relatively large contact area with the first-type device. Heat generated by the first-type device is conducted to the interior of the liquid cooling plate through a surface of the liquid cooling plate, and then the heat is conducted to the exterior of the first-type device by using liquid flowing in the liquid cooling plate, to implement heat dissipation on the first-type device. The liquid cooling plate may be disposed on a surface of each first-type device. When the server 15 is configured with a plurality of liquid cooling plates, the plurality of liquid cooling plates may be connected in series by using hoses, to simplify a liquid channel and simplify a structure of the server 15.

It should be noted that a quantity of liquid cooling plates used by a plurality of first-type devices is not limited in this embodiment of this application. In specific implementation, one liquid cooling plate may be used to cover surfaces of the plurality of first-type devices to perform heat dissipation on the plurality of first-type devices, or one liquid cooling plate may be used to cover a surface of each first-type device to perform heat dissipation on each first-type device.

It may be understood that the liquid channel in this embodiment is a channel through which liquid can flow in the cabinet, and the liquid channel includes the liquid channel in the liquid cooling component 152, a channel in a liquid distribution pipe 133, a hose connecting channels, and the like.

To further simplify the liquid channel and reduce interference of the liquid channel to another channel or line, the heat dissipation apparatus 13 may further include the liquid distribution pipe 133. The liquid distribution pipe 133 is connected between the liquid cooling unit 131 and the liquid cooling component 152, to connect the liquid cooling channel of the liquid cooling component 152 on each server 15 to the liquid cooling unit 131. In other words, the liquid cooling component 152 on each server 15 is connected to the liquid distribution pipe 133, and therefore, the liquid cooling component 152 on each server 15 is connected to the liquid cooling unit 131 by using the liquid distribution pipe 133. To be specific, the liquid distribution pipe 133 may distribute the relatively low-temperature cooling liquid that is provided by the liquid cooling unit 131 to the liquid cooling component 152 on each server 15; and the liquid distribution pipe 133 can also collect the relatively high-temperature reflux liquid that flows out of the liquid cooling component 152 on each server 15 into the liquid cooling unit 131. Therefore, there is no need to connect the liquid cooling component 152 on each server 15 to the liquid cooling unit 131 by using a hose. This helps reduce a quantity of hoses in the liquid channel and simplify the liquid channel.

For example, in FIG. 3, one liquid distribution pipe 133 is used as an example for description. The liquid distribution pipe 133 includes a liquid inlet pipe 133a and a liquid outlet pipe 133b, and the liquid inlet pipe 133a and the liquid outlet pipe 133b are disposed side by side. The liquid inlet pipe 133a is configured to distribute the relatively low-temperature cooling liquid that is provided by the liquid cooling unit 131 to the liquid cooling component 152 on each server 15. The liquid outlet pipe 133b collects the relatively high-temperature reflux liquid that flows out of the liquid cooling component 152 on each server 15 into the liquid cooling unit 131. The liquid inlet pipe 133a and the liquid outlet pipe 133b may be connected to the liquid cooling unit 131 by using hoses.

A floating liquid cooling joint 154 configured to connect to the liquid cooling component 152 on each server 15 is disposed on the liquid distribution pipe 133, or a floating liquid cooling joint 154 configured to connect to the liquid distribution pipe 133 is disposed on each server 15. In this way, when the server 15 is connected to the liquid distribution pipe 133, there is a specific fault tolerance range, namely, a fit tolerance, thereby helping improve reliability of connection between the server 15 and the liquid distribution pipe 133.

For example, the floating liquid cooling joint 154 may be disposed based on performance of elastic deformation of a spring. For example, springs may be disposed along up-down, front-rear, and left-right directions of the body 11, so that the server 15 and the liquid distribution pipe 133 have fault tolerance ranges, namely, fit tolerances, in three dimensions. The fault tolerance range, namely, the fit tolerance, may be ±2 mm. A specific structure of the floating liquid cooling joint 154 is not limited in this embodiment, and specifically, a common arrangement in this field may be used. Details are not described herein.

It may be understood that, when the server 15 is connected to the liquid distribution pipe 133 by using the floating liquid cooling joint 154, a sealing structure such as a sealing ring, a sealant, or a waterproof boss may be disposed at a connection part, to help avoid liquid leakage.

Optionally, the liquid distribution pipe 133 and the liquid cooling unit 131 are located on a same side of the body 11. For example, both the liquid distribution pipe 133 and the liquid cooling unit 131 are located on the rear side of the body 11, to facilitate connection between the liquid distribution pipe 133 and the liquid cooling unit 131. This further simplifies the liquid channel.

In addition, the liquid distribution pipe 133 may alternatively be integrated with the liquid cooling unit 131, to simplify an assembly process and help reduce liquid leakage.

Figure 4:
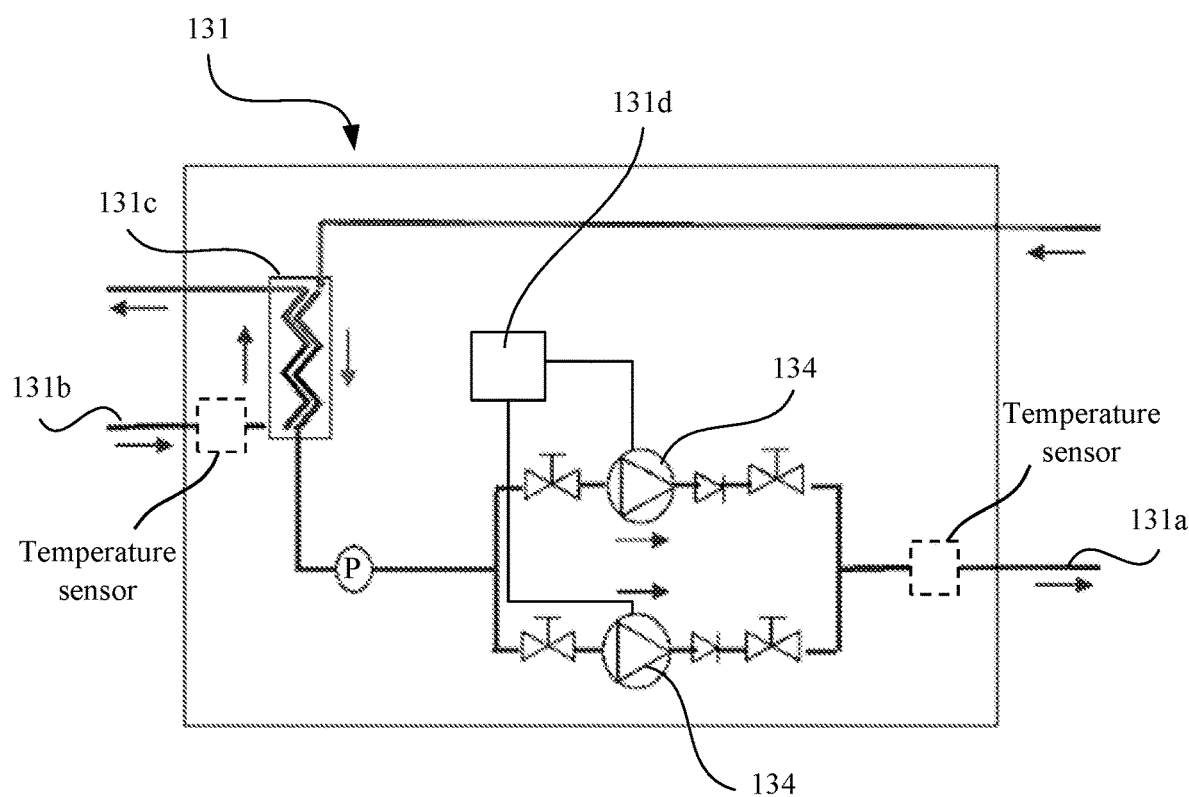
FIG. 4 is a schematic structural diagram of a liquid cooling unit according to an embodiment of this application.

Optionally, as shown in FIG. 4 (in which an arrow is used to indicate a flow direction of liquid), the liquid cooling unit 131 may include a first heat exchanger 131c, an inner circulation path 131a, and an outer circulation path 131b. The inner circulation path 131a is connected to the liquid cooling component 152 on the server 15. The first heat exchanger 131c may exchange heat with the inner circulation path 131a and the outer circulation path 131b, to cool the liquid in the inner circulation path 131a. For example, the liquid cooling unit 131 may include a liquid cooling CDU. A structure of the liquid cooling CDU may use a common arrangement in this field.

The first heat exchanger 131c is mainly configured to provide a place for heat exchange between the inner circulation path 131a and the outer circulation path 131b. A water outlet end of the inner circulation path 131a is connected to the liquid inlet pipe 133a of the liquid distribution pipe 133, to supply relatively low-temperature cooled liquid that is obtained after heat exchange with the outer circulation path 131b to the liquid cooling component 152 on each server 15. A water inlet end of the inner circulation path 131a may be connected to the liquid outlet pipe 133b of the liquid distribution pipe 133, and therefore, the relatively high-temperature reflux liquid that flows out of the liquid cooling component 152 on each server 15 is collected, and exchanges heat with the outer circulation path 131b in the first heat exchanger 131c.

A water inlet end of the outer circulation path 131b may be connected to a water source that can provide relatively low-temperature liquid, such as a water tower. A water outlet end of the outer circulation path 131b may be connected to a device that can recover relatively high-temperature liquid, such as the water tower, to perform processing such as cooling on the relatively high-temperature liquid.

For example, the first heat exchanger 131c may include a first channel and a second channel. A wall between the first channel and the second channel is disposed, that is, a partition board may be disposed between the first channel and the second channel. The partition board may be made of a material with excellent thermal conductivity, for example, a metal material. The first channel may be connected to the inner circulation path 131a, and the second channel may be connected to the outer circulation path 131b. The relatively high-temperature reflux liquid that flows out of the liquid cooling component may enter the first heat exchanger through the water inlet end of the inner circulation path 131a; when passing through the first channel, the relatively high-temperature reflux liquid may come in heat-transfer contact with liquid in the outer circulation path 131b in the second passage by using the partition board, to conduct heat of the relatively high-temperature reflux liquid to the liquid in the outer circulation path 131b; and the cooled liquid may be supplied to the liquid cooling component from the water outlet end of the inner circulation path 131a, to perform heat dissipation on the first-type device.

Optionally, a water pump 134 is further disposed in the heat dissipation apparatus 13, and the water pump 134 is configured to provide power for liquid to flow between the liquid cooling unit 131 and the liquid cooling component 152. The water pump 134 may be disposed in the inner circulation path 131a of the liquid cooling unit 131, or the water pump 134 may be disposed between the liquid distribution pipe 133 and the liquid cooling unit 131, as long as the water pump 134 can provide power for the liquid to flow between the liquid cooling unit 131 and the liquid cooling component 152.

Optionally, the water pump 134 may be disposed in the inner circulation path 131a of the liquid cooling unit 131, for example, disposed near the water outlet end of the inner circulation path 131a, to ensure a flow rate of the cooling liquid. The water pump 134 may be integrated with the first heat exchanger 131c or the like, to improve an integration degree and facilitate assembly.

Optionally, the liquid cooling unit 131 further includes a controller 131d, and there are a plurality of water pumps 134. The plurality of water pumps 134 are electrically connected to the controller 131d, and the controller 131d is configured to control a working status of each water pump 134. This improves working flexibility of the heat dissipation apparatus 1. The controller 131d may be disposed in the liquid cooling unit 131, so that the controller 131d is electrically connected to the water pump 134, to further improve an integration degree. The controller 131d may specifically use a processor to implement a function of the controller. The processor may be various computing devices running software, such as a central processing unit (CPU), a microprocessor, a digital signal processor (DSP), a microcontroller unit (MCU), or an artificial intelligence processor, where each processor may include one or more cores configured to execute a software instruction to perform an operation or processing. The processor may be further implemented by using an application-specific integrated circuit (ASIC) or a programmable logic device (PLD). The PLD may be a complex programmable logic device (CPLD), a field-programmable gate array (FPGA), a generic array logic (GAL), or any combination thereof In a working process of the cabinet 1, the controller 131d is configured to control working statuses such as an on/off state of each water pump 134 and a flow rate of liquid output from the output end. The controller 131d may synchronously control a working status of each water pump 134, or synchronously control working statuses of some water pumps 134, or separately control a working status of each water pump 134.

In a possible embodiment, the cabinet 1 further includes a sensor. The sensor is configured to send power consumption information of each node to the controller 131d, and the controller 131d dynamically adjusts a working status of each water pump 134 in the liquid cooling unit 131 based on the power consumption of each node in the cabinet. When the total power consumption of the nodes in the entire cabinet is greater than or equal to a first threshold, the controller 131d may control the water pumps 134 to work in a first working state, namely, a first mode; or when the total power consumption of the nodes in the entire cabinet is less than a first threshold, the controller 131d may control the water pumps 134 to work in a second working state, namely, a second mode. Power generated by the water pumps 134 in the first mode is higher than power generated by the water pumps 134 in the second mode. In other words, a speed of liquid flowing through a surface of the first-type device under the control of the water pumps 134 in the first mode is higher than a speed of the liquid flowing through the surface of the first-type device under the control of the water pumps 134 in the second mode. That is, rotational speeds of the water pumps 134 in the first mode are higher, and further can take away more heat.

In a possible embodiment, a temperature sensor may be further disposed in the liquid cooling unit 131. The temperature sensor is electrically connected to the controller 131d. The temperature sensor may be disposed at the water inlet end of the inner circulation path 131a, to detect temperature of liquid at the water inlet end of the inner circulation path 131a. The controller 131d may control the working status of each water pump 134 based on the temperature of liquid that is detected by the temperature sensor. Certainly, the temperature sensor may alternatively be disposed at the water outlet end of the outer circulation path 131b, to detect temperature of liquid at the water outlet end of the outer circulation path 131b.

When the detected liquid temperature is greater than or equal to a second threshold, the controller 131d may control the water pumps 134 to work in a first mode; and when the detected liquid temperature is less than the second threshold, the controller 131d may control the water pumps 134 to work in a second mode. Power generated by the water pumps 134 in the first mode is higher than power generated by the water pumps 134 in the second mode. In other words, a speed of liquid flowing through a surface of the first-type device under the control of the water pumps 134 in the first mode is higher than a speed of the liquid flowing through the surface of the first-type device under the control of the water pumps 134 in the second mode. That is, rotational speeds of the water pumps 134 in the first mode are higher, and further can take away more heat.

Optionally, when a plurality of water pumps 134 exist in the liquid cooling unit 131, the controller 131d may further control working statuses of the water pumps 134 in different task sharing modes. For example, when the plurality of water pumps 134 work in a load sharing mode, the plurality of water pumps jointly undertake work of liquid flowing through a plurality of servers. In a specific embodiment, different thresholds may be preset to control rotational speeds of the plurality of water pumps, to effectively perform heat dissipation on the first-type device on the server. When the plurality of water pumps 134 work in an active/standby mode, only one or more water pumps in an active state are responsible for undertaking the work of the liquid flowing through a plurality of servers. When the water pumps in the active state are faulty, a water pump in a standby state takes over a heat dissipation process of the faulty water pumps, to ensure effective heat dissipation performed on the servers. The above working modes improve a maintenance capability of the liquid cooling unit while effectively ensuring heat dissipation of the server. When a water pump is faulty, another water pump can take over the work of the water pump, thereby reducing impact on the servers in the entire cabinet, and improving maintenance efficiency.

In a possible embodiment, some of the plurality of water pumps 134 are water pumps in an active state, namely, main water pumps, and the remaining water pumps 134 are water pumps in a standby state, namely, auxiliary water pumps.

The cabinet 1 may further include a detection unit. The detection unit is configured to electrically connect to the controller 131d. The detection unit is configured to detect a working parameter of a main water pump, such as a flow rate of output liquid, to determine whether the main water pump is abnormal. The controller 131d is further configured to: after it is determined that the main water pump is abnormal, control an auxiliary water pump to start, and generate a corresponding prompt signal at the same time. In this way, a prompt device sends a visual prompt and/or an auditory prompt based on the prompt signal, to remind a worker in time. The prompt device may be an indicator, a display, a buzzer, or the like.

In this way, the main water pump and the auxiliary water pump are disposed, and when the main water pump is abnormal due to a fault or the like, the auxiliary water pump may be started, to help avoid an entire machine shutdown phenomenon and ensure heat dissipation effects of a device such as the server 15.

In a possible embodiment, to improve heat dissipation efficiency of the cabinet, in addition to the liquid cooling unit 131, the heat dissipation apparatus 13 may further include an air-to-liquid unit 132. The air-to-liquid unit 132 and a fan 157 on the server 15 are separately disposed on two sides of the body 11 along an installation direction. In this way, the air-to-liquid unit 132 performs air cooling on a second-type device passing through an internal memory 153 on the server 15 and that is not provided with the liquid cooling component 152.

The air-to-liquid unit 132 may work with the fan 157 of the server 15, that is, the fan 157 on the front side of the server 15 blows hot air in the body 11 to the air-to-liquid unit 132, and liquid in the air-to-liquid unit 132 performs heat exchange with the hot air to form cold air to be discharged. This can reduce impact of exhaust air of each cabinet on internal temperature of the data center equipment room, and reduce impact on other cabinet servers around the cabinet, thereby help reduce other heat dissipation apparatuses such as an air conditioner in the data center equipment room, to reduce costs.

For example, the air-to-liquid unit 132 may use a partition wall heat exchanger, and may include at least one of the following: an air-to-liquid heat exchanger, a finned radiator, or a radiating pipe. Structures of the air-to-liquid heat exchanger, the finned radiator, and the radiating pipe may use common arrangements in this field. Details are not described herein again in this embodiment.

To further improve heat dissipation effects, a plurality of air-to-liquid units 132 may be included. The plurality of air-to-liquid units 132 are symmetrically arranged relative to the liquid cooling unit 131. The plurality of air-to-liquid units 132 may use radiators of a same type, or may use radiators of different types.

In some embodiments, the air-to-liquid unit 132 may be integrated with the liquid cooling unit 131, to improve an integration degree of the heat dissipation apparatus 1. For ease of description, in the following embodiments of this application, it is an example in which the liquid cooling unit 131 is a coolant distribution unit CDU. The coolant distribution unit extends in a left-right direction, and fins or radiating pipes may be disposed in an area of the coolant distribution unit corresponding to an air duct in the body 11, to perform heat exchange with hot air in the body 11 by using liquid of the coolant distribution unit to achieve a purpose of air cooling.

Figure 5:
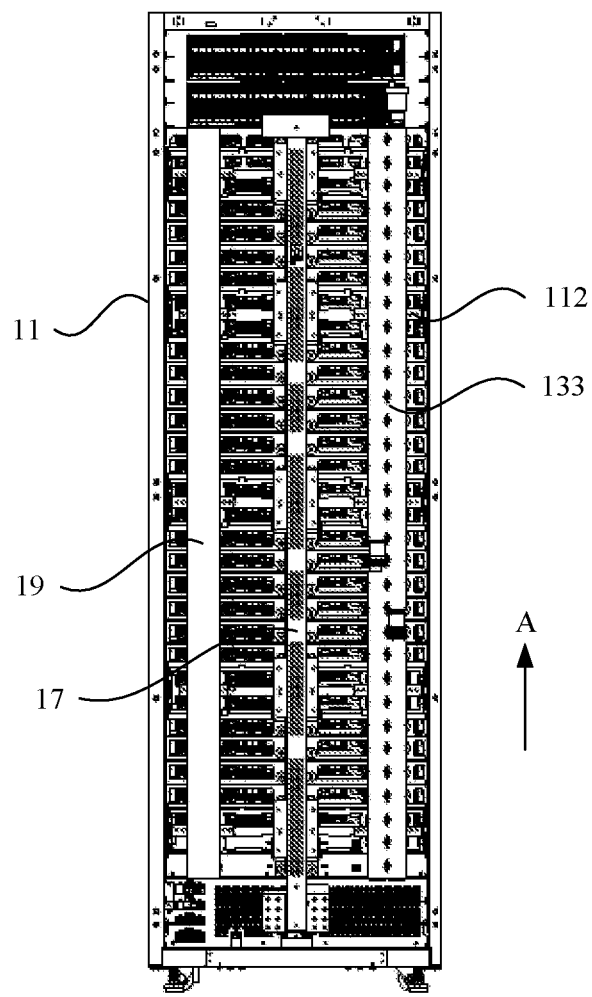
FIG. 5 is a rear view of a cabinet in which a liquid cooling unit or an air-to-liquid unit is not installed according to an embodiment of this application.
Figure 6:
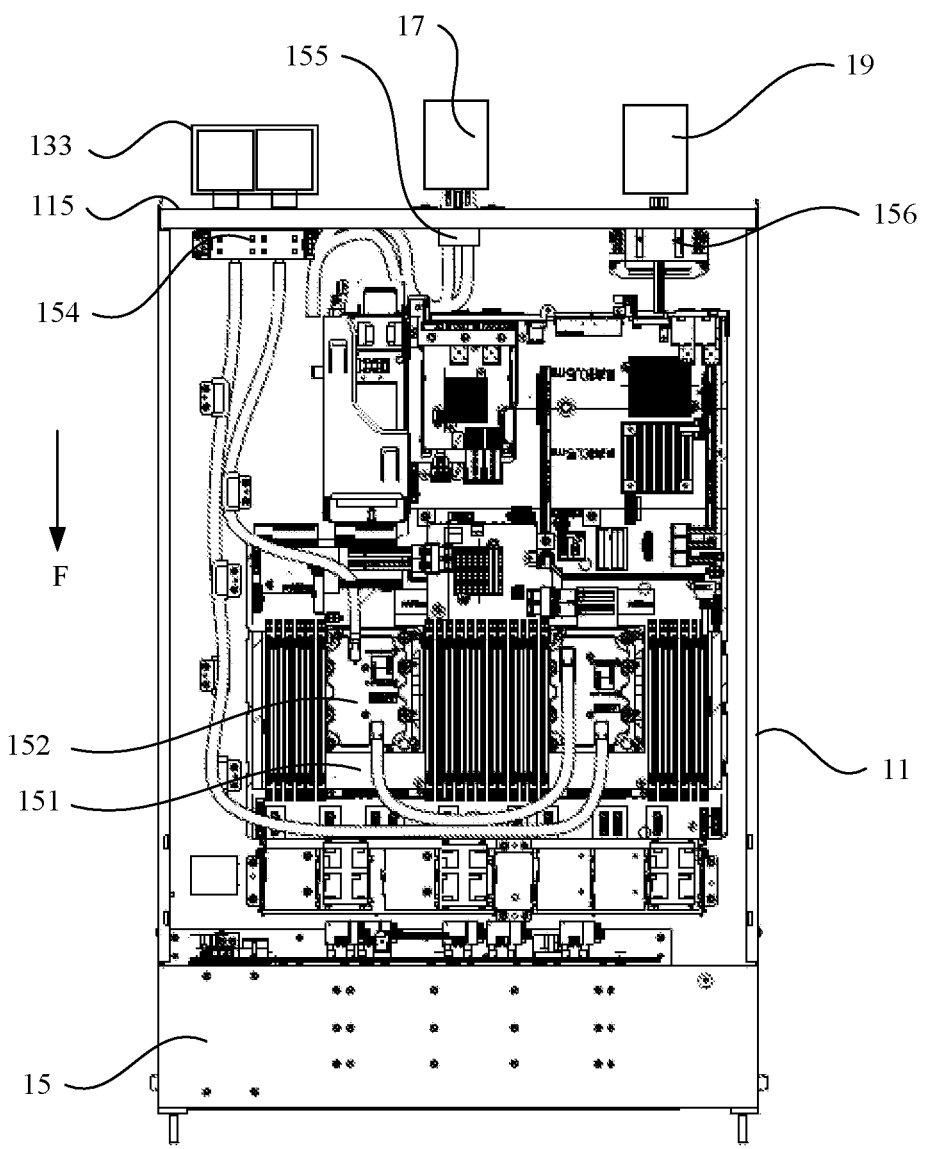
FIG. 6 is a top view of a cabinet in which a liquid cooling unit or an air-to-liquid unit is not installed according to an embodiment of this application.
Figures 7, 8:
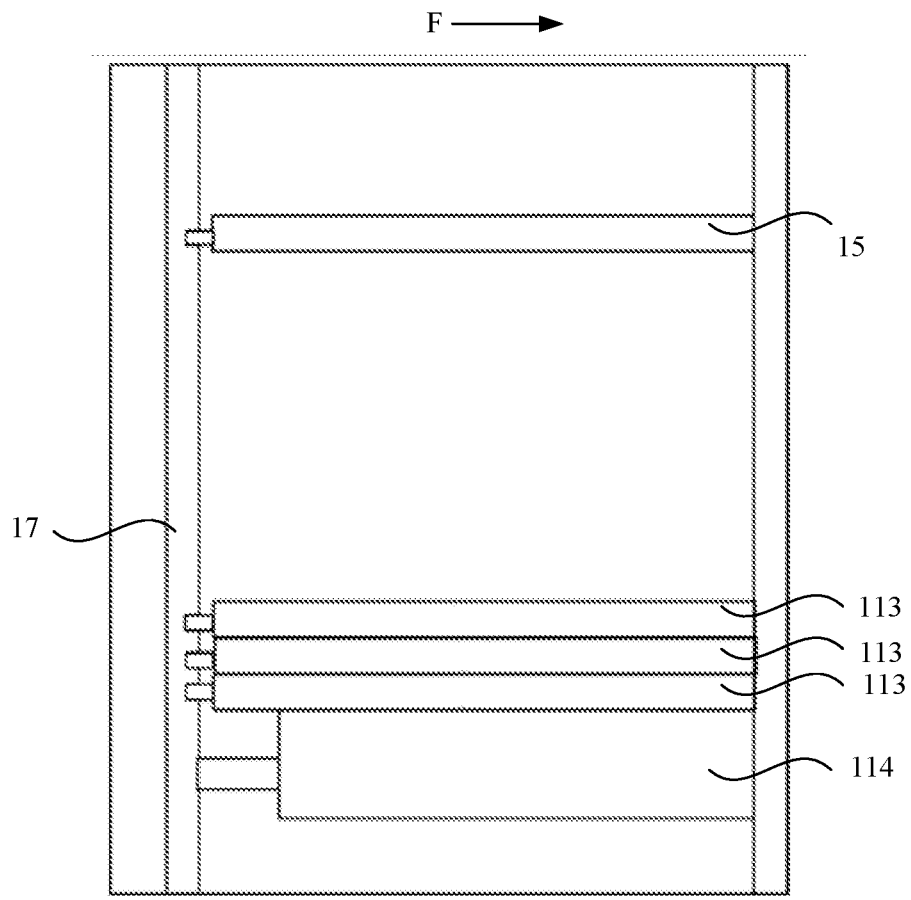
FIG. 7 is a front view of a cabinet in which a liquid cooling unit or an air-to-liquid unit is not installed according to an embodiment of this application.
FIG. 8 is a schematic flowchart of a heat dissipation method according to an embodiment of this application.

Optionally, as shown in FIG. 5 to FIG. 7, the cabinet 1 further includes a cable path 19. The cable path 19 and the heat dissipation apparatus 13 are located on a same side of the body 11, and the cable path 19 is configured to communicatively connect each server 15 to a corresponding switch.

The cable path 19 is formed by using a bundled cable, and the bundled cable may extend from top to bottom, thereby helping the bundled cable separately connect to each server 15 and connect to a device such as the switch.

Due to arrangement of a unified cable path 19, in this embodiment, a respective cable of each server 15 does not need to connect to each switch. This helps reduce a quantity of cables in the body 11 and simplify cable layout, and helps reduce interference of the cable path 19 to another path, line, or pipeline, thereby helping avoid a problem such as a maintenance difficulty caused by excessive cables.

Both the cable path 19 and the heat dissipation apparatus 13 are disposed on the rear side of the body 11. In this way, when a device in a server is maintained, it is convenient to operate from the front side of the cabinet, thereby reducing detachment of the cable path 19, the heat dissipation apparatus 13, and the like on the rear side of the body 11, and improving maintenance convenience.

Optionally, a floating signal connector 156 that is configured to separately connect to each server 15 is disposed on the cable path 19, or a floating signal connector 156 that is configured to connect to the cable path 19 is disposed on each server 15. When the floating signal connector 156 is disposed on one of the cable path 19 and the server 15, a blind mating plug matching the floating signal connector 156 is disposed on the other. In addition, the cable path 19, the floating signal connector 156, and the blind mating plug can all meet a requirement of high-speed signal transmission.

In this way, when the server 15 is connected to the cable path 19, there may be a specific fault tolerance range, namely, a fit tolerance, thereby helping improve reliability of connection between the server 15 and the cable path 19.

For example, the floating signal connector 156 may be disposed based on performance of elastic deformation of a spring, for example, springs may be disposed separately along up-down, front-rear, and left-right directions of the body 11, and therefore, the server 15 and the cable path 19 have fault tolerance ranges, namely, fit tolerances, in three dimensions. The fault tolerance range, namely, the fit tolerance, may be ±2 mm. A specific structure of the floating signal connector 156 is not limited in this embodiment, and specifically, may use a common arrangement in this field. Details are not described herein again.

Optionally, the cabinet 1 further includes a power supply path 17. The power supply path 17 and the heat dissipation apparatus 13 are located on a same side of the body 11, and the power supply path 17 is configured to supply electric energy to each server 15.

Both the power supply path 17 and the heat dissipation apparatus 13 are disposed on the rear side of the body 11. In this way, when a device in a server is maintained, it is convenient to operate from the front side of the cabinet, thereby reducing detachment of the power supply path 17, the heat dissipation apparatus 13, and the like on the rear side of the body 11, and improving maintenance convenience.

The power supply path 17 may include a power supply copper bar. The power supply copper bar may extend in an up-down direction to cooperate with each server 15, and may cooperate with the server 15 at any position thereof.

A floating power connector 155 that is configured to connect to the wire supply channel is disposed on each server 15, and therefore, when the server 15 is installed, there may be a specific fault tolerance range, namely, a fit tolerance, thereby helping installation of the server 15.

For example, the floating power connector 155 may be disposed based on performance of elastic deformation of a spring, for example, springs may be disposed separately along up-down, front-rear, and left-right directions of the body 11, and therefore, the server 15 has fault tolerance ranges, namely, fit tolerances, in three dimensions. The fault tolerance range, namely, the fit tolerance, may be ±2 mm. A specific structure of the floating power connector 155 is not limited in this embodiment, and specifically, may use a common arrangement in this field. Details are not described herein again.

In this embodiment, it may be understood that the cable path 19, the power supply path 17, and the liquid distribution pipe 133 in the heat dissipation apparatus 13 may be disposed side by side in a direction perpendicular to the installation direction and parallel to the server 15. That is, the cable path 19, the power supply path 17, and the liquid distribution pipe 133 may be arranged side by side from left to right.

An arrangement sequence of the cable path 19, the power supply path 17, and the liquid distribution pipe 133 is not specifically limited in this embodiment, and may be specifically configured according to an actual requirement. For example, an arrangement position of the power supply path 17 may be configured based on a position of an output port of a power supply module in the body 11.

Optionally, at least one fastening beam 115 is disposed on the body 11. The fastening beam 115 is perpendicular to the installation direction and is disposed parallel to the server 15, and the cable path 19, the power supply path 17, and the liquid distribution pipe 133 in the heat dissipation apparatus 13 are all fastened to the fastening beam 115. This improves accuracy of relative positions of the cable path 19, the power supply path 17, and the heat dissipation apparatus 13, that is, facilitates co-plane of matching parts between the cable path 19, the power supply path 17, and the liquid distribution pipe 133 and the servers 15, thereby helping ensure reliability of matching between the servers 15 and the cable path 19, the power supply path 17, and the liquid distribution pipe 133. In specific implementation, each fastening beam 115 is disposed horizontally with one server 15, to ensure that each server 15 can be connected to the cable path 19, the power supply path 17, and the heat dissipation apparatus 13 by using the fastening beam.

Optionally, the power supply module is disposed in the body 11, and the power supply module supplies electric energy to each server 15 through the power supply path 17. The power supply module includes at least one of the following: a power module 114 or a battery module 113 that may be installed in the installation slot 111. The power module 114 may be fastened to the body 11 in a connection manner such as a fastening, clamping, or bonding manner. The battery module 113 may be installed in the installation slot 111 of the body 11. In this case, a quantity of battery modules 113 may be set according to an actual requirement.

In the cabinet 1 provided in this embodiment, the heat dissipation apparatus 13 is disposed, to meet a heat dissipation requirement of the device such as the server 15. The heat dissipation apparatus 13, the cable path 19, and the power supply path 17 are disposed on the rear side of the body 11, and therefore, not only occupation of available space in the body 11 is reduced, but also limitation on a size of the body 11 and a size of a device in the body 11 is reduced. When the device in the body 11 is maintained, blockage of cables or the like to the device in the body 11 is reduced, thereby helping improve maintenance convenience of the device in the body 11. The heat dissipation apparatus 13, the cable path 19, and the power supply path 17 are disposed at the rear opening 112 of the body 11, and the rear opening 112 of the body 11 provides operation space for maintenance of the heat dissipation apparatus 13, and the like. Therefore, when the heat dissipation apparatus 13 and the like are repaired, the heat dissipation apparatus 13 and the like do not need to be detached, thereby helping avoid an entire machine shutdown phenomenon.

In addition, a plurality of water pumps 134 are disposed, and working statuses of the water pumps 134, such as a flow rate of liquid output by the water pumps 134, a startup quantity, and the like, can be dynamically adjusted based on working parameters such as a temperature and a power of the interior of the body 11. This improves flexibility of the heat dissipation apparatus 13. In addition, the plurality of water pumps 134 may work in an active/standby mode, and therefore, when a main water pump is abnormal, an auxiliary water pump (namely, a standby water pump) is started in time. This further helps avoid an entire machine shutdown phenomenon.

This embodiment further provides a heat dissipation method. The heat dissipation method may be applied to the heat dissipation apparatus in any one of the foregoing embodiments, and may have same or corresponding technical effects as the foregoing heat dissipation apparatus. Referring to FIG. 8, the heat dissipation method includes the following steps.

S101. Control a heat dissipation apparatus to start a liquid cooling mode, to perform liquid cooling on first-type devices on servers.

In the liquid cooling mode, a liquid cooling unit in the heat dissipation apparatus may be in a working status. A specific working process of the liquid cooling unit may be similar to that described in the foregoing embodiments, and details are not described herein again.

With respect to the liquid cooling mode in step S101, the heat dissipation method may further include: detecting power and/or temperature of the interior of the body, and adjusting, based on the detected power and/or temperature, a flow rate of liquid accelerated by a water pump in the heat dissipation apparatus, to improve heat dissipation efficiency and meet a heat dissipation requirement. For example, when the power and/or the temperature of the interior of the body is relatively high, a rotational speed of the water pump is increased, and therefore, a flow rate of liquid flowing through a liquid cooling plate is increased, to improve heat dissipation efficiency. Alternatively, when the power and/or the temperature of the interior of the body is relatively low, the rotation speed of the water pump is reduced, and therefore, the flow rate of the liquid flowing through the liquid cooling plate is reduced, to reduce heat dissipation efficiency. In this way, a heat dissipation requirement is met, and simultaneously, energy saving and power consumption reduction may be implemented.

When there are a plurality of water pumps, a quantity of started water pumps or a flow rate of liquid output by each water pump may be controlled based on the detected power and/or temperature. For example, when the power and/or the temperature of the interior of the body is relatively high, the quantity of started water pumps is increased, to improve heat dissipation efficiency and meet a heat dissipation requirement. Alternatively, when the power and/or the temperature of the interior of the body is relatively low, the quantity of started water pumps is reduced, to reduce heat dissipation efficiency. In this way, a heat dissipation requirement is met, and simultaneously, energy saving and power consumption reduction may be implemented.

For example, a total power consumption value of servers in a cabinet may be obtained, and the total power consumption value is compared with a first threshold. If the total power exceeds the first threshold, the plurality of water pumps are set to be in a first working state; or if the total power is less than the first threshold, the plurality of water pumps are set to be in a second working state. Rotational speeds of the water pumps working in the first working state are greater than rotational speeds of the water pumps working in the second working state.

For example, temperature of liquid at a water inlet end of an inner circulation path or a water outlet end of an outer circulation path in the liquid cooling unit of the heat dissipation apparatus may be obtained, and the temperature of the liquid is compared with a second threshold. If the temperature of the liquid exceeds the second threshold, the plurality of water pumps are set to be in a first working state; or if the temperature of the liquid is less than the second threshold, the plurality of water pumps are set to be in a second working state. Rotational speeds of the water pumps working in the first working state are greater than rotational speeds of the water pumps working in the second working state.

Optionally, the heat dissipation apparatus may be controlled to enter an active/standby mode. A working process of the heat dissipation apparatus may be similar to the foregoing, and details are not described herein again. When there are a plurality of water pumps, some water pumps may be set as main water pumps, and the rest water pumps are auxiliary water pumps. Operating parameters of the main water pumps may further be detected, to determine whether the main water pumps are abnormal based on the operating parameters of the main water pumps. If it is determined that the main water pumps are abnormal, the auxiliary water pumps are controlled to start. In this way, when the main water pumps are abnormal due to a fault or the like, the auxiliary water pumps may be started, to help avoid an entire machine shutdown phenomenon and ensure heat dissipation effects of a device such as a server. In addition, the heat dissipation apparatus may be controlled to enter a load sharing mode. A working process of the heat dissipation apparatus may be similar to the foregoing, and details are not described herein again.

In addition, after it is determined that the main water pumps are abnormal, a prompt signal may be generated, and therefore, a visual prompt and/or an auditory prompt may be sent based on the prompt signal, to remind a worker in time.

S102. Control the heat dissipation apparatus to start an air cooling mode, to perform air cooling on second-type devices on the servers.

In the air cooling mode, an air-to-liquid unit in the heat dissipation apparatus and a fan of the server may be in a working status. Specific working processes of the liquid cooling unit and the fan may be similar to that described in the foregoing embodiments, and details are not described herein again.

With respect to the air cooling mode in step 5102, the heat dissipation method may further include: detecting power and/or temperature of the interior of the body, and adjusting, based on the detected power and/or temperature, a rotational speed of a fan on the server, to adjust air cooling efficiency. For example, when the power and/or the temperature of the interior of the body is relatively high, a rotational speed of the fan is increased, to improve air cooling efficiency, namely, heat dissipation efficiency. Alternatively, when the power and/or the temperature of the interior of the body is relatively low, the rotation speed of the fan is reduced, to reduce heat dissipation efficiency. In this way, a heat dissipation requirement is met, and simultaneously, energy saving and power consumption reduction may be implemented. Certainly, a flow rate of liquid in the air-to-liquid unit may be adjusted based on the detected power and/or temperature, to adapt to the rotational speed of the fan.

In addition, it should be noted that an execution sequence of step S101 and step S102 is not limited in this embodiment. Step S101 and step S102 may be performed simultaneously; or step S101 is performed first, and then step S102 is performed; or step S102 is performed first, and then step S101 is performed.

Figure 9:
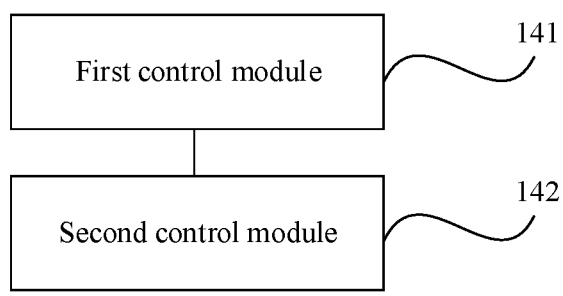
FIG. 9 is a structural block diagram of a heat dissipation apparatus according to an embodiment of this application.

As shown in FIG. 9, an embodiment of this application further provides a heat dissipation apparatus, applied to a cabinet, and including: a first control module 141, configured to control the heat dissipation apparatus to start a liquid cooling mode, to perform liquid cooling on first-type devices on servers in the cabinet; and a second control module 142, configured to control the heat dissipation apparatus to start an air cooling mode, to perform air cooling on second-type devices on the servers.

In a possible implementation, the first control module 141 is further configured to: obtain a total power consumption value of the servers in the cabinet, and compare the total power consumption value with a first threshold; and if the total power exceeds the first threshold, set a plurality of water pumps to be in a first working state; or if the total power is less than the first threshold, set a plurality of water pumps to be in a second working state. Rotational speeds of the water pumps working in the first working state are greater than rotational speeds of the water pumps working in the second working state.

In a possible implementation, the first control module 141 is further configured to control a plurality of water pumps to enter a load sharing mode, so that the plurality of water pumps work together.

In a possible implementation, the first control module 141 is further configured to control a plurality of water pumps to enter a load active/standby mode, so that a water pump in a standby state is started when a water pump in an active state is abnormal.

In a possible implementation, the first control module 141 is further configured to: obtain temperature of liquid at a water inlet end of an inner circulation path or a water outlet end of an outer circulation path in a liquid cooling unit of the heat dissipation apparatus, and compare the temperature of the liquid with a second threshold; and if the temperature of the liquid exceeds the second threshold, set a plurality of water pumps to be in a first working state; or if the temperature of the liquid is less than the second threshold, set a plurality of water pumps to be in a second working state. Rotational speeds of the water pumps working in the first working state are greater than rotational speeds of the water pumps working in the second working state.

Figure 10:
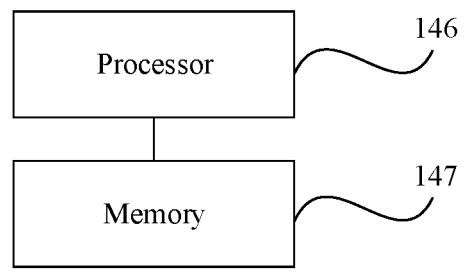
FIG. 10 is a structural block diagram of a heat dissipation apparatus according to another embodiment of this application.

As shown in FIG. 10, an embodiment of this application further provides a heat dissipation apparatus, applied to a cabinet, and including a processor 146, and a memory 147 that is configured to store processor-executable instructions. The processor 146 is configured to execute the executable instructions to implement any one of the foregoing steps.

In the foregoing description, a description of a reference term such as "an embodiment", "some embodiments", "an example", "a specific example", or "some examples" means that a specific feature, structure, or characteristic that is described with reference to the embodiment or the example is included in at least one embodiment or example of the embodiments of this application. In this specification, the foregoing example expressions of the terms are not necessarily with respect to a same embodiment or example. In addition, the described specific feature, structure, material, or characteristic may be combined in a proper manner in any one or more of the embodiments or examples. In addition, persons skilled in the art may integrate or combine different embodiments or examples and characteristics of different embodiments or examples described in this specification, as long as they do not conflict with each other.

Finally, it should be noted that the foregoing embodiments are merely intended for describing the technical solutions of the embodiments of this application other than limiting the embodiments of this application. Although the embodiments of this application are described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of this application.

What is claimed is:

1. A cabinet comprising:
    a body comprising:
        a front side;
        a rear side; and
        installation slots configured to dispose servers into the cabinet based on an installation direction from the front side to the rear side, wherein at least one of the servers comprises a first device, and wherein the first device comprises a liquid cooling component;
    a heat dissipation apparatus disposed on the front side or the rear side, detachably connected to the body, configured to dissipate heat for the first device, and comprising a liquid distribution pipe, wherein the liquid distribution pipe comprises:
        a liquid cooling joint configured to connect to the liquid cooling component;
        a liquid inlet pipe; and
        a liquid outlet pipe;
    a cable path configured to transmit signals to a second device; and
    a power supply path configured to provide electric energy for the cabinet and the servers,
    wherein the liquid distribution pipe, the cable path, and the power supply path are separate components, are separately and detachably connected to the rear side, and comprise floating connectors configured to implement blind mating of the at least one of the servers, and
    wherein the liquid inlet pipe, the liquid outlet pipe, the cable path, and the power supply path are disposed side by side in a parallel manner.

2. The cabinet of claim 1, wherein the heat dissipation apparatus is further configured to perform heat dissipation on the servers using an air cooling manner, a liquid cooling manner, or an air cooling and liquid cooling hybrid manner.

3. The cabinet of claim 1, wherein the cable path is formed through a bundled cable.

4. The cabinet of claim 3, wherein the bundled cable extends from a top of the body to a bottom of the body.

5. The cabinet of the claim 1, further comprising a fastening beam disposed on the body, perpendicular to the installation direction, and parallel to the servers, wherein the liquid distribution pipe, the cable path, and the power supply path are all fastened to the fastening beam.

6. The cabinet of claim 1, wherein the liquid cooling joint is a floating liquid cooling joint.

7. The cabinet of claim 6, wherein the floating liquid cooling joint is configured to connect the servers to the liquid distribution pipe with a fit tolerance.

8. The cabinet of claim 6, wherein the installation slots comprise front openings configured to accept the servers, and wherein the heat dissipation apparatus is disposed on the rear side and opposite the front openings.

9. The cabinet of claim 6, wherein the liquid cooling component is on a surface of a component that is of the first device and that has a relatively high power consumption.

10. The cabinet of claim 6, wherein the liquid cooling component comprises a liquid cooling plate.

11. The cabinet of claim 9, wherein the component comprises a central processing unit (CPU).

12. The cabinet of claim 1, wherein the liquid distribution pipe, the cable path, and the power supply path are disposed along a direction perpendicular to the installation direction.

13. The cabinet of claim 1, wherein the second device is a switch.

14. A server system comprising:
servers, wherein at least one of the servers comprises a first device, wherein the first device comprises a liquid cooling component;
a second device; and
a cabinet housing the second device and comprising:
 a body comprising:
  a front side;
  a rear side; and
  installation slots configured to dispose the servers into the cabinet based on an installation direction from the front side to the rear side;
 a heat dissipation apparatus disposed on the front side or the rear side, detachably connected to the body, configured to dissipate heat for the first device, and comprising a liquid distribution pipe, wherein the liquid distribution pipe comprises:
  a liquid cooling joint connected to the liquid cooling component;
  a liquid inlet pipe; and
  a liquid outlet pipe;
 a cable path configured to transmit signals to the second device; and
 a power supply path configured to provide electric energy for the cabinet and the servers,
 wherein the liquid distribution pipe, the cable path, and the power supply path are separate components, are separately and detachably connected to the rear side, and comprise floating connectors implementing blind mating of the at least one of the servers; and
 wherein the liquid inlet pipe, the liquid outlet pipe, the cable path, and the power supply path are disposed side by side in a parallel manner.

15. The server system of claim 14, wherein the first device further comprises a component, wherein the component comprises a surface and has a relatively high power consumption, and wherein the liquid cooling component is disposed on the surface.

16. The server system of claim 14, wherein the second device is a switch.

17. The server system of claim 14, wherein the heat dissipation apparatus is further configured to perform heat dissipation on the servers using an air cooling manner, a liquid cooling manner, or an air cooling and liquid cooling hybrid manner.

18. The server system of claim 14, wherein the cable path is formed through a bundled cable.

19. The server system of claim 18, wherein the bundled cable extends from a top of the body to a bottom of the body.

20. The server system of claim 14, wherein the cabinet further comprises a fastening beam disposed on the body, perpendicular to the installation direction, and parallel to the servers, and wherein the liquid distribution pipe, the cable path, and the power supply path are all fastened to the fastening beam.

* * * * *